United States Patent [19]

Sherstinsky et al.

[11] Patent Number: 5,634,266

[45] Date of Patent: Jun. 3, 1997

[54] METHOD OF MAKING A DIELECTRIC CHUCK

[75] Inventors: Semyon Sherstinsky, San Francisco; Shamouil Shamouilian, San Jose; Manoocher Birang, Los Gatos; Alfred Mak, Union City; Simon W. Tam, Milpitas, all of Calif.

[73] Assignee: Applied Materials Inc., Santa Clara, Calif.

[21] Appl. No.: 449,135

[22] Filed: May 24, 1995

Related U.S. Application Data

[62] Division of Ser. No. 203,111, Feb. 28, 1994.

[51] Int. Cl.⁶ .................................................. H01R 43/00
[52] U.S. Cl. ........................... 29/825; 279/128; 361/234
[58] Field of Search ............................. 29/825, 527.2, 29/530; 279/128; 361/234

[56] References Cited

U.S. PATENT DOCUMENTS

| | | | |
|---|---|---|---|
| 5,055,964 | 10/1991 | Logan et al. | 361/234 |
| 5,207,437 | 5/1993 | Barnes et al. | 279/128 |
| 5,275,683 | 1/1994 | Arami et al. | 156/345 |
| 5,382,311 | 1/1995 | Ishikawa et al. | 156/345 |
| 5,384,682 | 1/1995 | Watanabe et al. | |
| 5,452,510 | 9/1995 | Barnes et al. | 29/527.2 X |

FOREIGN PATENT DOCUMENTS

| | | | |
|---|---|---|---|
| A3017101 | 2/1986 | European Pat. Off. | H01L 21/68 |
| A2036052 | 3/1990 | European Pat. Off. | H01L 21/00 |
| WO8809054 | 11/1988 | WIPO | H01L 21/68 |
| WO9103833 | 3/1991 | WIPO | H01L 21/00 |

*Primary Examiner*—Carl J. Arbes
*Attorney, Agent, or Firm*—Raymond K. Kwong; Noel F. Heal

[57] ABSTRACT

A method of making a dielectric chuck for securing a semiconductor wafer on a pedestal having multiple apertures for the introduction of cooling gas beneath the wafer. The wafer is held by electrostatic force against a laminate of an electrode layer sandwiched between two dielectric layers in accordance with the method, such that the laminate presents a planar surface to the wafer for a substantial distance beyond the outer edge of the electrode layer. The laminate construction method ensures that a large wafer area beyond the outer edge of the electrode is in contact with the laminate, to minimize cooling gas leakage near the edge, and provides a longer useful life by increasing the path length of dielectric material between the electrode layer and potentially damaging plasma material surrounding the chuck.

1 Claim, 4 Drawing Sheets

METHOD OF MAKING A DIELECTRIC CHUCK

This application is a divisional application of prior U.S. application Ser. No. 08/203,111, filed Feb. 28, 1994.

BACKGROUND OF THE INVENTION

This invention relates generally to electrostatic chucks used to secure semiconductor wafers in processing chambers and, more particularly, to significant improvements that enhance wafer cooling and increase the useful life of chucks of this type.

Electrostatic chucks are used in semiconductor processing chambers to hold individual semiconductor substrates or wafers on a chamber pedestal. An electrostatic chuck typically includes a dielectric layer and an electrode. A semiconductor wafer is placed in contact with the dielectric layer and a dc voltage is applied to the electrode to create an electrostatic attractive force to grip the wafer to the chuck. Chucks of this type are particularly useful in vacuum processing environments in which there is insufficient differential pressure to hold the wafer in position, or in which mechanical clamping of the wafer is undesirable. One processing environment in which the electrostatic chuck is widely used is the plasma etch process.

Although an electrostatic chuck may be formed using only a single dielectric layer and an electrode, a more typical configuration includes a thin laminate member having an electrode core, which is preferably a thin copper layer, sandwiched between upper and lower dielectric layers or an organic material such as polyimide. A polyimide adhesive may be used to assemble these layers into a single laminate sheet, and to attach the laminate the chamber pedestal.

The upper and lower polyimide layers merge at the circumferential edge of the electrode to prevent exposure of the copper electrode to the process chamber, which usually contains a plasma that would damage the copper. In operation, the copper electrode is connected to a voltage source and functions as an anode. The principles of operation of electrostatic chucks are well known and not critical to the present invention. It is sufficient to note that an electric field formed above the pedestal results in mutual attraction between the pedestal and a semiconductor wafer placed in contact with the laminate.

Many processes to which wafers are subjected result in the generation of heat, and means must be provided to cool the wafer to an acceptable process temperature to prevent heat damage. In most electrostatic chucks of the prior art, helium gas is introduced beneath the wafer through a central aperture in the pedestal, and is then distributed through a pattern of grooves in the laminate on the pedestal. Various groove patterns have been used in an effort to distribute the cooling gas uniformly across the wafer surface, which is generally circular in shape. A difficulty inherent to this cooling technique prevents uniform cooling near the wafer edge. If the grooves are continued all the way to wafer edge, there is a high rate of gas leakage and an accompanying reduction in the cooling effect, especially near the edge. In most designs, the grooves are terminated before they reach the edge. In some designs, radial grooves adjoin secondary grooves near the edge, and the secondary grooves may extend circumferentially for short distances before terminating, or may take the form of branch grooves extending in various directions before terminating. In all these designs, however, there is still undesirable overheating of the wafer near its peripheral edge.

Another drawback of electrostatic chucks of the prior art arises from the way the laminate of polyimide and copper is formed on the chuck pedestal. A first layer of polyimide is placed over the pedestal and then the copper electrode is placed over the polyimide. Of course, the copper layer cannot extend all the way to the edge of the polyimide, because the polyimide layers have to overlap and provide a seal around the outer edge of the copper. When the second polyimide layer is placed over the copper, the total thickness of the laminate is smaller around the polyimide edge (the thickness of two polyimide layers) than the total laminate thickness including the copper. Therefore, the laminate has an annular step outside the outer diameter of the copper layer. This annular step has two detrimental effects on the performance of the electrostatic chuck. First, because of the step there is only a very small region of the chuck providing contact with the wafer beyond the outer diameter of the copper layer. As a result, there is a high probability of helium leakage at the wafer edge, and unwanted overheating of the wafer edge region. A second effect of the annular step in the laminate structure is that the outer edge of the copper layer is insulated from the damaging chamber environment by only a very thin polyimide layer, having a thickness approximately the same as that of the upper polyimide layer. Once this layer is eroded away by the process plasma in the chamber, the chuck has to be replaced. Polyimide and other organic materials have a relatively low tolerance for many process gases and plasmas. Therefore, provision of a good insulating layer around the electrode is an important consideration.

It will be appreciated from the foregoing that there is a need for improvement in electrostatic chucks. In particular what is needed is an improved chuck construction to enhance cooling near the peripheral edge of the wafer and to lengthen the useful life of the chuck. The present invention satisfies this need, as will be apparent from the following summary.

SUMMARY OF THE INVENTION

The present invention resides in an electrostatic chuck providing greatly improved heat transfer between the wafer and the chuck, especially at the edge portion of the chuck, by distributing cooling gas through the chuck at multiple points across the area of the chuck pedestal. In addition, the chuck of the present invention presents a planar surface to the wafer all the way to the edge of a laminate mounted on the chuck pedestal, thereby further improving cooling of edge portions of the wafer and increasing the useful life of the chuck.

Briefly, and in general terms, the electrostatic chuck of the invention comprises a pedestal for supporting a workpiece; a laminate including an insulated copper electrode, attached to the pedestal, wherein the workpiece is electrostatically clamped to the laminate upon application of a voltage to the copper electrode; and a plurality of holes extending up through the pedestal and the laminate, to carry a gas for cooling the workpiece from beneath, many of the holes being positioned near the outer periphery of the workpiece. The pedestal also includes a cooling gas reservoir formed beneath the pedestal and extending across all of the holes, and a cooling gas supply port into the reservoir. Preferably, the holes are tapered to a smaller diameter at their top ends.

More specifically, the laminate includes a first insulating layer; a copper electrode layer formed over the first insulating layer; and a second insulating layer formed over the copper electrode and merging with the first insulating layer around edges of the copper electrode layer, to provide insulation of the copper from a process environment in which the electrostatic chuck is installed. In accordance with one aspect of the invention, the second insulating layer presents an upper surface that is substantially planar over the entire width of the laminate. Good contact is thereby maintained with the workpiece beyond the outer edge of the copper electrode. Moreover, the copper electrode is widely separated from the effects of the process plasma, to increase the useful life of the electrostatic chuck.

To achieve this planar upper surface, the pedestal has a recess formed in its upper surface. Therefore, the first insulating layer when placed over the pedestal conforms with the recess. The copper electrode substantially fills the recess, presenting a composite upper surface that is substantially planar and is then covered by the second insulating layer.

The electrostatic chuck of the invention may also be defined in more specific terms as including a pedestal for supporting a semiconductor substrate; and a laminate including an insulated copper electrode attached to the pedestal, wherein the substrate is electrostatically clamped to the laminate upon application of a voltage to the copper electrode. The laminate includes a first dielectric layer, a copper electrode layer over the first dielectric layer, and a second dielectric layer over the copper electrode and merging with the first dielectric layer around edges of the copper electrode layer, to provide insulation of the copper from a process environment in which the electrostatic chuck is installed. The second dielectric layer presents an upper surface that is substantially planar over the entire width of the laminate, so good contact is maintained with the substrate beyond the outer edge of the copper electrode. Further, the copper electrode is widely separated from the effects of the process plasma, to increase the useful life of the electrostatic chuck.

In terms of a novel method, the invention includes the steps of forming a shallow recess in the top of the pedestal, the recess having a depth equivalent to the thickness of the electrode; placing a first dielectric layer across pedestal; placing the electrode layer over the first dielectric layer, whereby the electrode layer fits within the shallow recess; and placing a second dielectric layer across the first dielectric layer and the electrode layer, to form a relatively planar surface. The electrode layer is then effectively insulated from the process environment by a relatively long insulation path, and the planar surface ensures good contact with the substrate in a region outside the outer edge of the electrode.

It will be appreciated from the foregoing that the present invention represents a significant advance in the field of electrostatic chucks. In particular, the invention provides a chuck in which overheating of the edge portion is virtually eliminated and temperature gradients are dramatically reduced. Moreover, the configuration of the laminate member of the chuck ensures better contact with wafer around its outer region and a longer useful life for the chuck.

Other aspects and advantages of the invention will become apparent from the following more detailed description, taken in conjunction with the drawings.

DESCRIPTION OF THE PREFERRED EMBODIMENT

Figure 1:
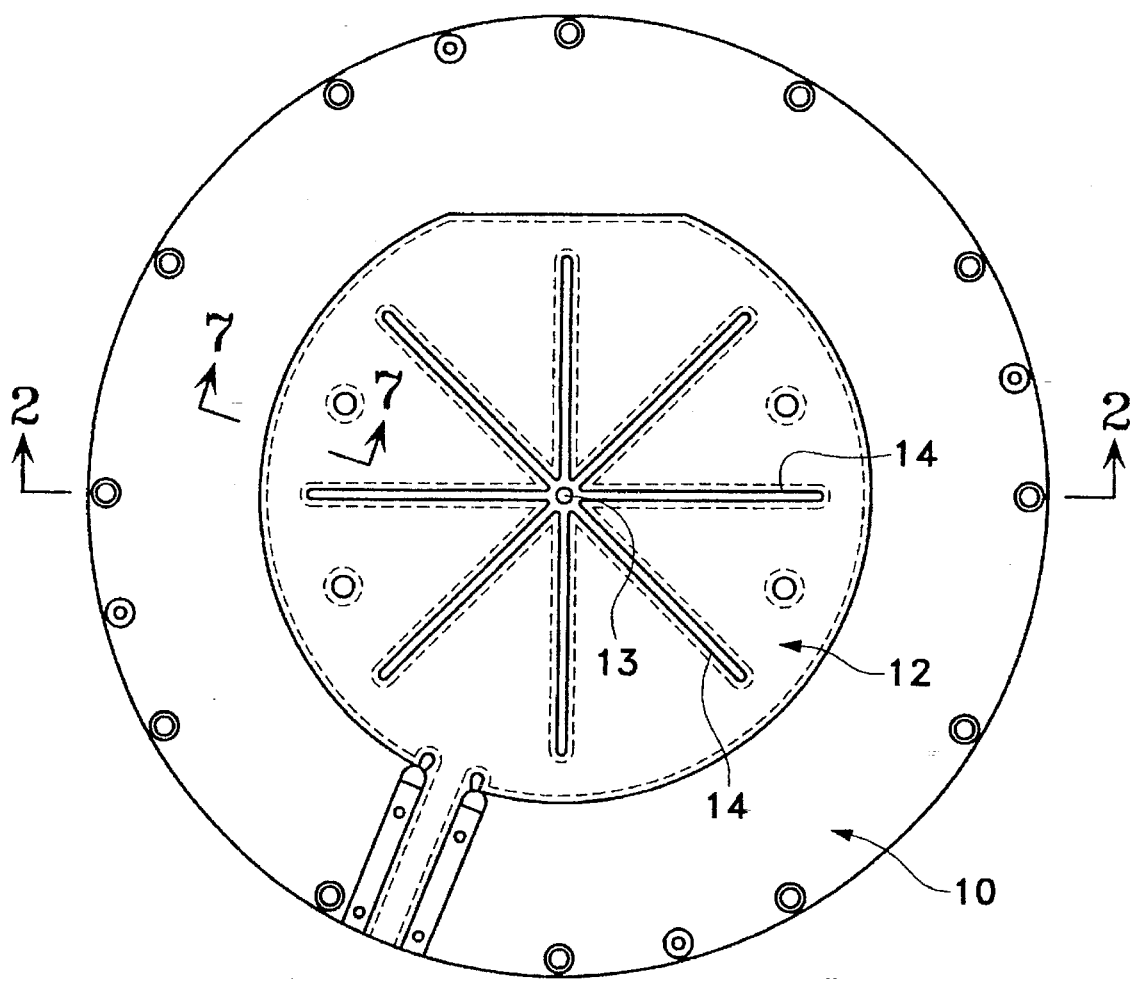
FIG. 1 is a plan view of an electrostatic chuck of the prior art, showing radial cooling grooves diverging from a central cooling supply passage in the chuck pedestal.
Figure 2:
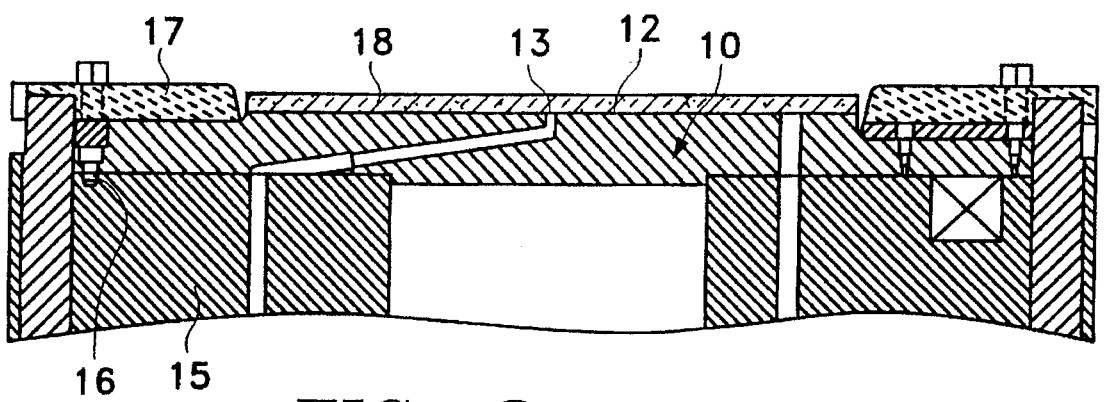
FIG. 2 is cross-sectional view of the prior art chuck of FIG. 1, taken substantially along the line 2—2, and also showing a semiconductor wafer supported on the chuck.
Figure 4:
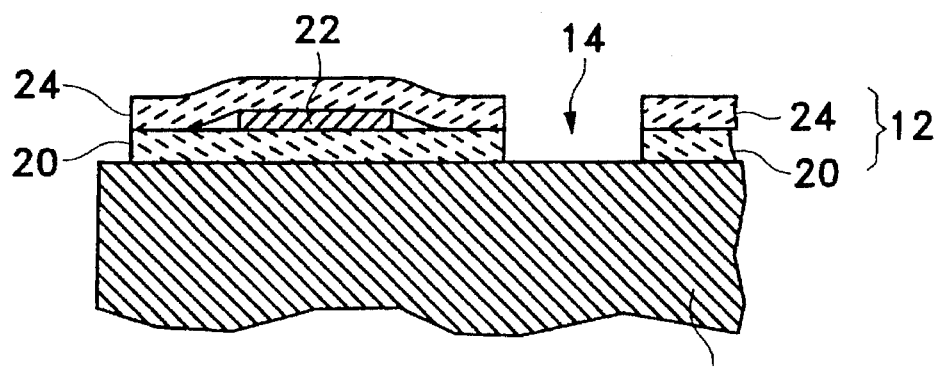
FIG. 4 is an enlarged fragmentary cross-sectional view of an electrostatic chuck of the prior art, depicting a portion of a laminate polyimide and copper layers formed over the chuck pedestal.

As shown in the drawings for purposes of illustration, the present invention is concerned with improvements in electrostatic chucks. As shown in FIGS. 1 and 2, a typical electrostatic chuck includes a pedestal, indicated by reference numeral 10, on which is mounted a laminate 12 of multiple layers (to be described). For simplicity, the laminate 12 is shown in FIG. 2 as a single line, its detailed structure being shown in FIG. 4. A central aperture 13 in the pedestal 10 extends up through the laminate 12 and communicates with multiple grooves 14 extending radially across the laminate 12 from the central aperture. The pedestal 10 is shown as being secured to a pedestal base 15 by screws 16. An annular insulating collar 17 is mounted on the pedestal. The top of the pedestal 10 and the laminate 12 are generally circular in shape, to match the outline of a semiconductor wafer 18 placed on the laminate. As best shown in FIG. 4, the laminate 12 includes a lower polyimide layer 20, a copper electrode layer 22 and an upper polyimide layer 24. The upper polyimide layer 24 merges and seals with the lower one 20 around the edges of the copper layer 22, both at the periphery of the laminate 12 and along each of the grooves 14, one of which is shown in FIG. 4.

Figure 3A:
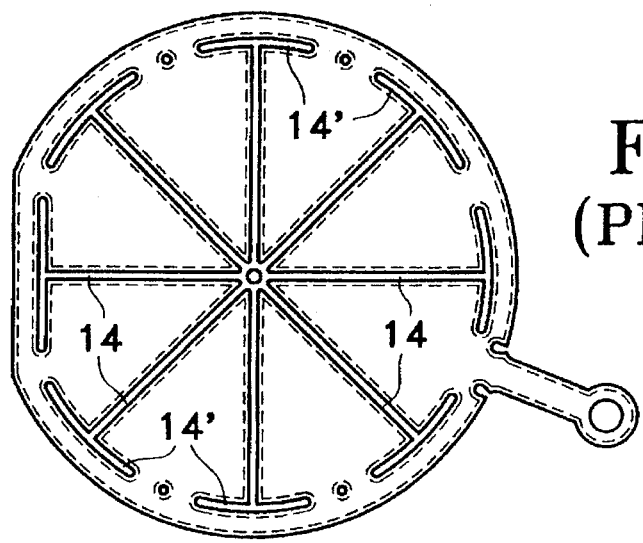
FIGS. 3A and 3B are diagrammatic plan views of electrostatic chucks of the prior art, depicting two alternative cooling groove configurations.
Figure 3B:
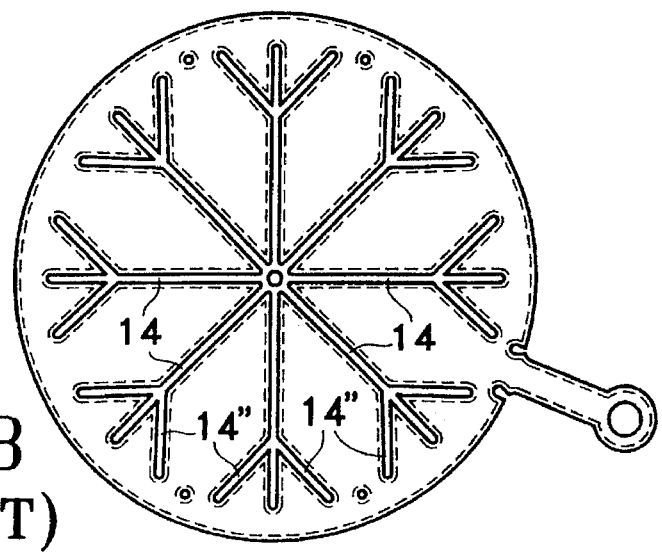

FIGS. 3A and 3B show alternative groove configurations that have been used in the past. In the configuration of FIG. 3A, each of the radial grooves 14 merges into an arcuate or part-circular groove 14' extending around the laminate 12 near its periphery. In the configuration of FIG. 3B, each of the radial grooves 14 adjoins additional groove branches 14", which extend toward the laminate periphery in different directions. These and other groove configurations are all attempts to provide sufficient cooling gas near the edge of the wafer 18 without placing grooves so near to the edge that excessive cooling gas leakage occurs. All of these configurations suffer from a common deficiency: overheating of the wafer edge region. In all cases there is little heat transfer and electrostatic clamping pressure in the area of the grooves and there are large temperature gradients at the wafer edge.

Figure 7:
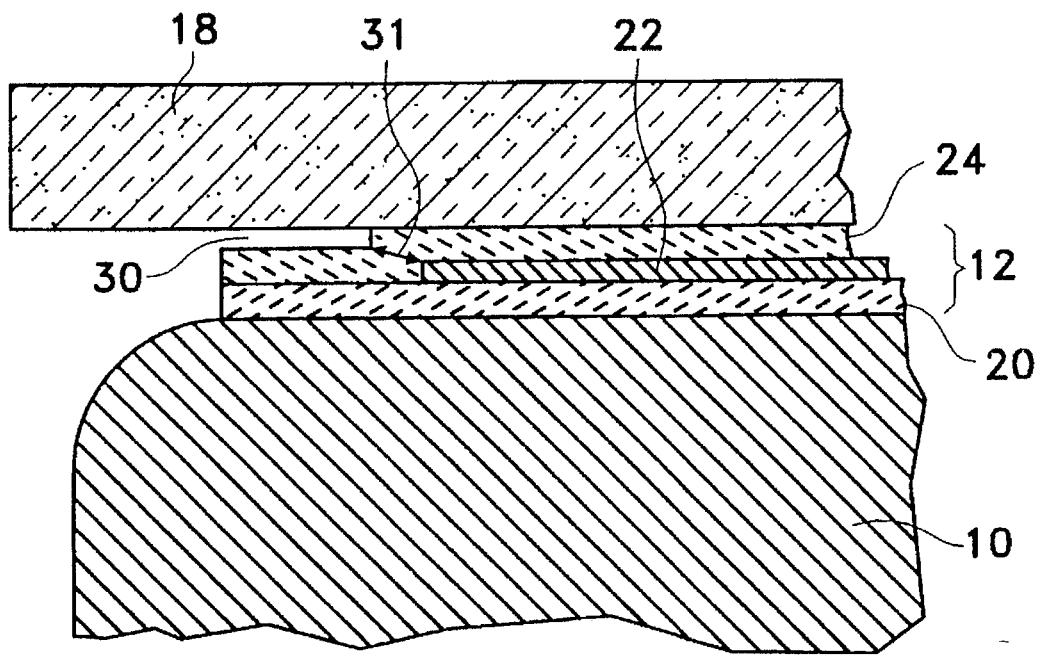
FIG. 7 is a fragmentary cross-sectional view of an electrostatic chuck of the prior art, taken substantially along the line 7—7 of FIG. 1 and showing how the laminate of polyimide and copper layers is formed on the chuck pedestal.

Another significant disadvantage of electrostatic chucks of the prior art is illustrated in FIG. 7, which depicts an edge region of the laminate 12 and wafer 18 in detail. The laminate 12 is formed by first placing the lower polyimide layer 20 on the pedestal 10, then placing the copper electrode layer 22 over the lower polyimide layer, and finally forming the upper polyimide layer 24 over the first two layers 20 and 22. Necessarily, this construction leaves an annular gap 30 between the upper polyimide layer 24 and the wafer 18 because the thickness of the two polyimide layers is less than the combined thickness of the two polyimide layers and the copper layer. This laminate construction has two detrimental effects. First, because the wafer 18 is not supported by the laminate 12 in the region of the gap 30, there is only a very small region of wafer-to-laminate contact beyond the outer diameter of the copper layer 22. There is no electrostatic chucking force developed beyond the outer edge of the copper layer 22. Therefore, cooling helium gas supplied at a pressure of several torr, up to 20 torr, leaks into the process chamber over this small region. This leakage of the cooling gas results in lower gas pressures and higher temperatures near the wafer edge. The size of the copper electrode 22 is limited by the size of the pedestal 10 and by the requirement for minimum overlap (approximately 1.5 mm) of the polyimide layers 20 and 24.

The second detrimental effect of the annular gap 30 is that, because the process plasma is present in the gap, the minimum insulation of the copper provided by the laminate is the distance 31 between the outer edge of the copper layer 22 and the annular gap 30. In known chucks, this distance is close to the thickness of one of the polyimide layers, which is approximately 0.025 to 0.050 mm. This small insulation thickness results in a relatively short useful life for the chuck.

Figure 8:
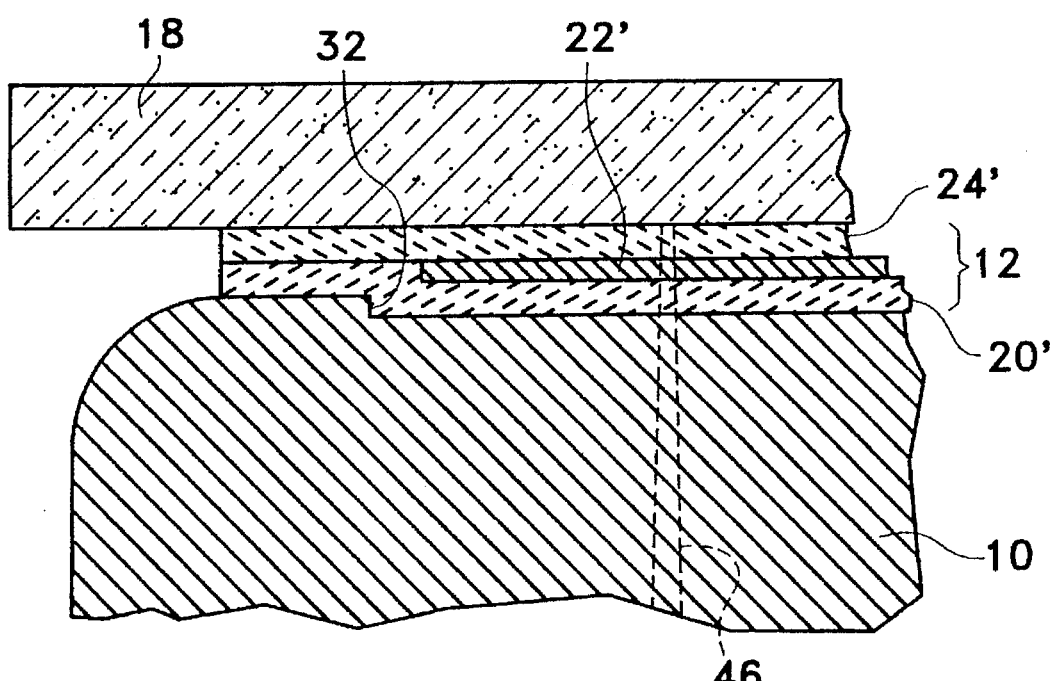
FIG. 8 is fragmentary cross-sectional view similar to FIG. 7, but showing a structure in accordance with the present invention.

In accordance with one important aspect of the invention, and as shown in FIG. 8, the laminate 12 is formed in such a way as to present a planar upper surface extending well beyond the outer diameter of the copper layer 22. Specifically, the copper layer 22' is recessed into the lower polyimide layer 20' and these two layers present a planar surface on which the upper polyimide layer 24' is formed. One way to recess 32 the copper layer 22' by an appropriate amount is to first form a circular recess 32 in the top surface of the pedestal 10, by machining a counterbore of diameter selected to be greater than the diameter of the copper electrode 22' by approximately 0.1 to 0.2 mm. The depth of the recess is the same as the thickness of the copper electrode 22', i.e., approximately 0.040 mm. Then the lower polyimide layer 20' fills the recess in the pedestal 10 and leaves a corresponding recess in the upper surface of the lower polyimide layer, into which the copper layer 22' is placed.

This construction overcomes the disadvantages of the prior art discussed with reference to FIG. 7. In particular, because the laminate 12 presents a planar upper surface well beyond outer diameter of the copper layer 22', the outer regions of the wafer 18 have a greater area of contact with the laminate and edge leakage is reduced. Also, the annular gap 30 of FIG. 7 is eliminated in FIG. 8 and the minimum insulation thickness between the copper layer 22' and the plasma is increased to approximately 1.5 mm, i.e., by a factor of thirty or more. Therefore, the useful life of the chuck is significantly extended and its process performance is improved.

Figure 5:
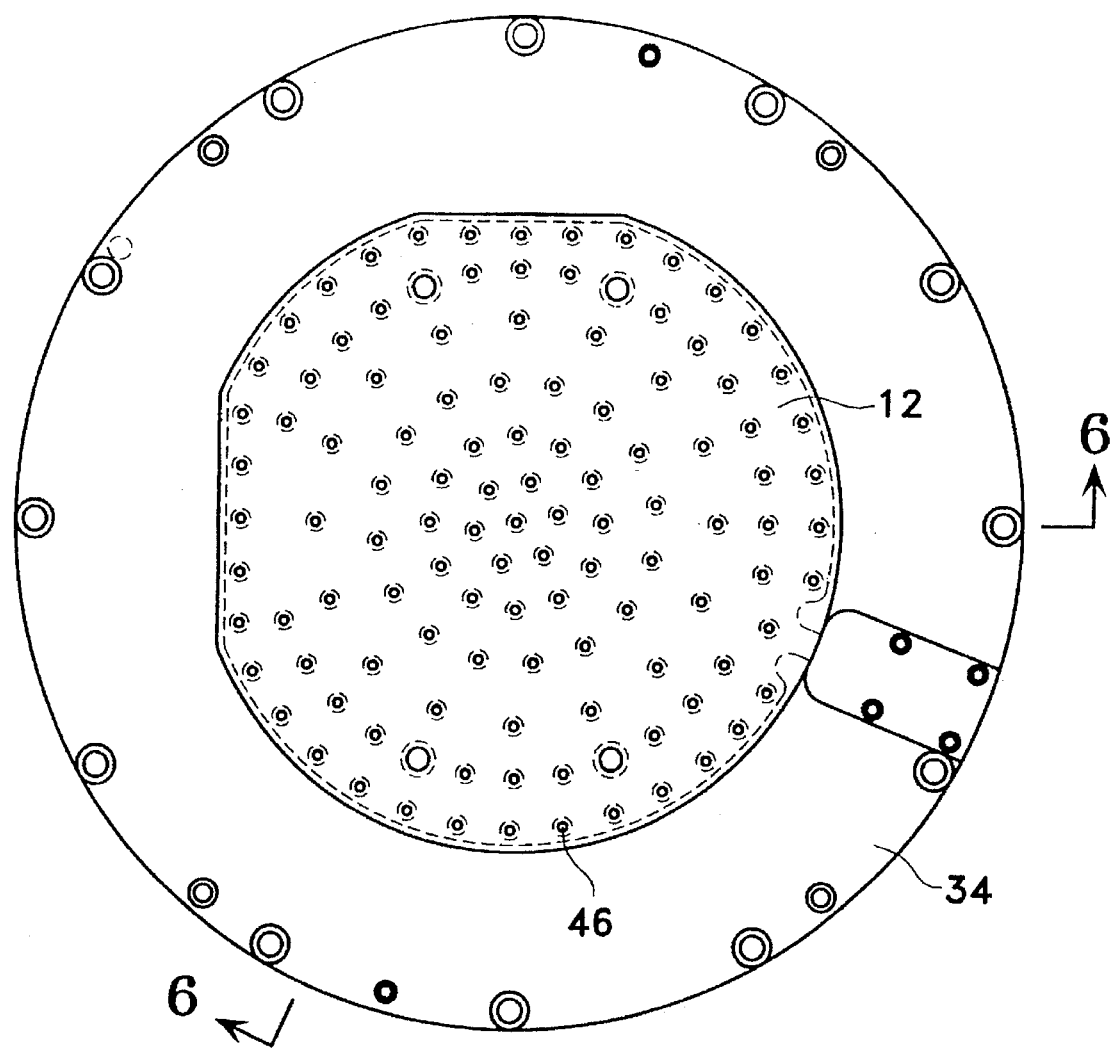
FIG. 5 is a plan view of an electrostatic chuck in accordance with the present invention, showing multiple cooling holes formed in the chuck pedestal.
Figure 6:
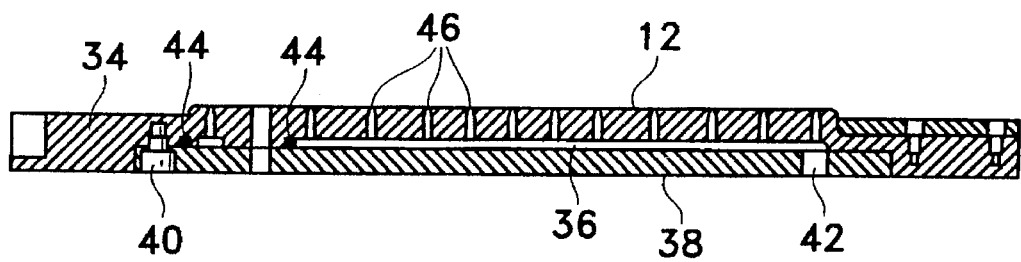
FIG. 6 is a cross-sectional view of the electrostatic chuck of FIG. 5, taken substantially along the line 6—6.

Another important aspect of the invention is its use of multiple apertures to introduce cooling gas on the lower face of the wafer 18. This is best shown in FIGS. 5 and 6, in which a pedestal 34 is provided with a coolant reservoir 36 extending across the bottom of the pedestal and formed in part by a circular plate 38 secured to the pedestal by screws 40. Cooling gas is introduced into the reservoir 36 through a single passage 42, which may be at one edge of the reservoir, and O-rings 44 seal the reservoir. There are multiple holes 46 formed through the pedestal to its upper surface. Holes in corresponding positions (not shown) are also formed in the laminate 12, which, for simplicity, is shown in this figure as a single line. The holes 46 are formed similarly to the way grooves were formed in prior art structures. (See FIG. 4.) There may be as many as 100–200 holes, many of which are positioned close to the edge of the laminate 12. The holes 46 are small in diameter; for example 0.25–0.50 mm, and are preferably tapered to a smaller diameter at the upper or outlet ends.

A test of a prototype of the invention in a tungsten etchback process resulted in an overall reduction of wafer temperature by approximately 10° C. and a reduction of the wafer temperature at its peripheral edge from 80° C. to approximately 60°–65° C. Moreover, the temperature gradient between the wafer center and its edge was reduced from 15°–20° C. to 6°–10° C. In contrast with difficulties associated with overheating in electrostatic chucks of the prior art, repeatable and acceptable process results were obtained using the chuck of the invention.

It appears from the test results on the prototype of the invention that a helium leak at the wafer edge that might have been regarded as excessive in chucks of the prior art is not detrimental to the process if the electrostatic chuck provides sufficient heat conductance and a sufficient helium supply to feed the leak at the wafer edge. For example, edge leakage in chucks of the prior art are approximately 0.2–1.0 sccm (standard cubic centimeters per minute), but in the chuck of the invention the presence of leakage in the range 2–5 sccm at 9 torr pressure showed no detectable effect on the process. Most of the leakage was from holes near the wafer edge. Blocking these holes reduced leakage by a factor of approximately ten, i.e. to 0.4–0.6 sccm, but caused wafer edge overheating and loss of selectivity.

It will be appreciated from the foregoing that the present invention represents a significant advance in the field of electrostatic chucks. In particular, the electrostatic chuck of the invention provides more efficient cooling over the entire wafer surface, especially the peripheral edge, improved clamping effect and wafer contact at the edge, and increased useful product life. It will also be appreciated that, although a specific embodiment of the invention has been described in detail for purposes of illustration, various modifications may be made without departing from the spirit and scope of the invention. Accordingly, the invention should not be limited except as by the appended claims.

We claim:

1. A method of making a dielectric chuck having a pedestal and a laminate member with an insulated electrode, the method comprising the steps of:

forming a shallow recess in the top of the pedestal, the recess having a depth equivalent to the thickness of the electrode;

placing a first dielectric layer across pedestal;

placing the electrode layer over the first dielectric layer, whereby the electrode layer fits within the recess;

placing a second dielectric layer across the first dielectric layer and the electrode layer, to form a relatively planar surface;

wherein the electrode layer is effectively insulated from the process environment by a relatively long insulator path.

* * * * *